US010145515B2

(12) United States Patent
Johnson (10) Patent No.: US 10,145,515 B2
(45) Date of Patent: Dec. 4, 2018

(54) LIGHTING DEVICE FOR ACCENT LIGHTING AND METHOD (71) Applicant: Blisslights, LLC, San Marcos, CA (US)

(72) Inventor: Randy E. Johnson, Escondido, CA (US)

(73) Assignee: Blisslights, LLC, San Marcos, CA (US)

( * ) Notice: Subject to any disclaimer, the term of this patent is extended or adjusted under 35 U.S.C. 154(b) by 0 days.

(21) Appl. No.: 15/208,477

(22) Filed: Jul. 12, 2016

(65) Prior Publication Data
US 2016/0320000 A1 Nov. 3, 2016

Related U.S. Application Data (63) Continuation of application No. 12/614,935, filed on Nov. 9, 2009, now abandoned.
(60) Provisional application No. 61/112,839, filed on Nov. 10, 2008.

(51) Int. Cl.

| F21V 5/00 | (2018.01) |
|---|---|
| F21K 9/237 | (2016.01) |
| F21S 10/00 | (2006.01) |
| F21V 21/35 | (2006.01) |
| G02B 26/08 | (2006.01) |
| G03H 1/08 | (2006.01) |
| G03H 1/22 | (2006.01) |
| F21S 8/00 | (2006.01) |
| F21V 29/71 | (2015.01) |
| F21K 9/23 | (2016.01) |
| F21V 29/77 | (2015.01) |
| F21K 9/238 | (2016.01) |
| G02B 5/32 | (2006.01) |
| H01S 5/042 | (2006.01) |
| F21W 131/406 | (2006.01) |

(Continued)

(52) U.S. Cl.
CPC ............ *F21K 9/237* (2016.08); *F21K 9/23* (2016.08); *F21K 9/238* (2016.08); *F21S 8/038* (2013.01); *F21S 10/00* (2013.01); *F21V 5/002* (2013.01); *F21V 21/35* (2013.01); *F21V 29/713* (2015.01); *F21V 29/777* (2015.01); *G02B 5/32* (2013.01); *G02B 26/0808* (2013.01); *G03H 1/08* (2013.01); *G03H 1/22* (2013.01); *G03H 1/2249* (2013.01); *H01S 5/0428* (2013.01); *F21W 2131/406* (2013.01); *F21Y 2115/10* (2016.08); *F21Y 2115/30* (2016.08); *G03H 2210/20* (2013.01); *G03H 2227/06* (2013.01)

(58) Field of Classification Search
CPC .............................................. F21K 9/23–9/238
See application file for complete search history.

(56) References Cited

U.S. PATENT DOCUMENTS

| 6,814,470 B2 * | 11/2004 | Rizkin | F21V 7/0091 362/240 |
|---|---|---|---|
| 7,144,135 B2 * | 12/2006 | Martin | F21S 6/003 362/294 |
| 2006/0007012 A1 * | 1/2006 | Machi | B64D 47/06 340/815.45 |

* cited by examiner

Primary Examiner — Sean Gramling
(74) Attorney, Agent, or Firm — Jacob W Neu; Bradley Arant Boult Cummings, LLP (57) ABSTRACT Embodiments of invention are directed to a lighting device for use in accent lighting applications. In one embodiment, the lighting device includes a coherent light source, such as a laser, and a diffractive optical element. The diffractive optical element may be, for example, a holographic optical element. The lighting device may be adapted to retrofit into a pre-existing light fixture. In one application, the lighting device may project a static or movable star field and/or static or movable clouds.

25 Claims, 7 Drawing Sheets (51) Int. Cl.
*F21Y 115/30* (2016.01)
*F21Y 115/10* (2016.01)

LIGHTING DEVICE FOR ACCENT LIGHTING AND METHOD

PRIOR APPLICATION

This is a continuation of U.S. patent application Ser. No. 12/614,935, filed Nov. 9, 2009 which claims the benefit of U.S. Provisional Patent Application Ser. No. 61/112,839, filed Nov. 10, 2008, incorporated herein by reference.

FIELD OF INVENTION

Lighting device for accent lighting applications.

BACKGROUND OF INVENTION

Lighting design is both a science and an art. Comprehensive lighting design requires consideration of the amount of functional light provided, the energy consumed, as well as the aesthetic impact supplied by the lighting system. Lighting in such venues as casinos, theatres, nightclubs and concert stages are primarily concerned with enhancing the appearance and emotional impact of the architecture or concert through lighting systems. Therefore, it is important that the sciences of light production and luminaire photometrics are balanced with the artistic application of light as a medium in our built environment. Often, accent lighting for the type of venues described above can be extremely sophisticated and costly.

Smaller venues, such as restaurants, small businesses or even a home, also employ accent lighting. Such accent lighting is typically limited to "dimmer" lighting capabilities and/or monochromatic lighting. To utilize more sophisticated lighting systems in these types of venues can require special equipment, extensive electrical rewiring, and can often be cost-prohibitive.

SUMMARY OF INVENTION

A lighting device, including: (a) a coherent light source; (b) a holographic optical element positioned within a light pathway of the coherent light source when power is supplied thereto; and (c) a switched-mode power supply (SMPS) in electrical communication with the coherent light source to supply power thereto, wherein the device is adapted to retrofit into a pre-existing light fixture is herein disclosed.

The lighting device may further include: (d) a housing to house the coherent light source, the housing having an opening to allow light emanating from the coherent light source to project therethrough; and (e) a first heatsink positioned about the housing. The first heatsink may define a lumen, the lumen having the housing therein, the first heatsink having a plurality of fins on an outer periphery thereof. The lighting device may further include a threaded base adapted to retrofit into a socket of the light fixture, the threaded based in electrical communication with the coherent light source. The lighting device may further include: (f) a plate to secure the housing and the first heatsink thereto; and (g) a second heatsink having a first recess to situate the plate therein and a second recess to house the SMPS, the second heatsink connected to the threaded base. The second heatsink may have a first end having a first diameter and a second end having a second diameter, the first diameter may be smaller than the second diameter, the second heatsink may have a plurality of fins on an outer periphery thereof. The lighting device may further include (h) a printed circuit board positioned between the threaded base and the second heatsink, the printed circuit board in electrical communication with the threaded base and the SMPS.

The coherent light source may be one of a diode pumped solid state laser or a direct diode laser. The holographic optical element may be embossed and integrated into collimation optics of the laser. When the lighting device is retrofitted to the light fixture and when power is supplied thereto, the lighting device may project a plurality of pin-point lights, the pin-point lights comprising a star field. The pre-existing light fixture may be one of a track light, an incandescent lighting fixture, a recessed can lighting fixture, an uplight or a spot light. The SMPS may be attached to the first heatsink. One end of the lighting device may be adapted to secure to a lens and the other end is adapted to secure to a plate. The lighting device may have dimming capabilities.

A lighting device adapted to retrofit into a pre-existing lighting fixture, comprising: (a) a coherent light source housed within a housing, the housing having an opening through which light from the coherent light source projects therethrough when power is supplied thereto; (b) a holographic optical element fixed within a retainer, the retainer positioned within a light pathway of the coherent light source when power is supplied thereto, the retainer having an opening in substantial alignment with the opening in the housing; (c) a switched-mode power supply (SMPS) in electrical communication with the coherent light source to supply power thereto; and (d) means for retrofitting the lighting device into a pre-existing lighting fixture is herein disclosed.

The lighting device may further include a heatsink positioned about the housing. The heatsink may define a lumen, the lumen having the housing therein, the heatsink having a plurality of fins on an outer periphery thereof. The coherent light source may be one of a diode pumped solid state laser or a direct diode laser. The holographic optical element may be embossed and integrated into collimation optics of the laser. When the lighting device is retrofitted to the light fixture and when power is supplied thereto, the lighting device may project a plurality of pin-point lights, the pin-point lights comprising a star field.

DETAILED DESCRIPTION

The following detailed description is of the best currently contemplated modes of carrying out the invention. The description is not to be taken in a limiting sense, but is made merely for the purpose of illustrating the general principles of the invention.

Embodiments of invention are directed to a lighting device for use in accent lighting applications. In one embodiment, the lighting device includes a coherent light source, such as a laser, and a diffractive optical element. The diffractive optical element may be, for example, a holographic optical element. The lighting device may be adapted to retrofit into a pre-existing light fixture. In one application, the lighting device may project a static or movable star field and/or static or movable clouds.

A diffractive optical element (DOE) is a class of optics that operates on the principle of diffraction. Traditional optical elements use their shape to bend light. By contrast, diffractive optics break apart incoming waves of light into a large number of waves which then recombine to form completely new waves. DOEs can function as grating, lenses, aspheric or any other type of optical element. They offer unique optical properties that are not possible with conventional optical elements. In addition, DOEs can be fabricated in a wide range of materials including, but not limited to, aluminum, silicon, silica or plastic.

Figure 1:
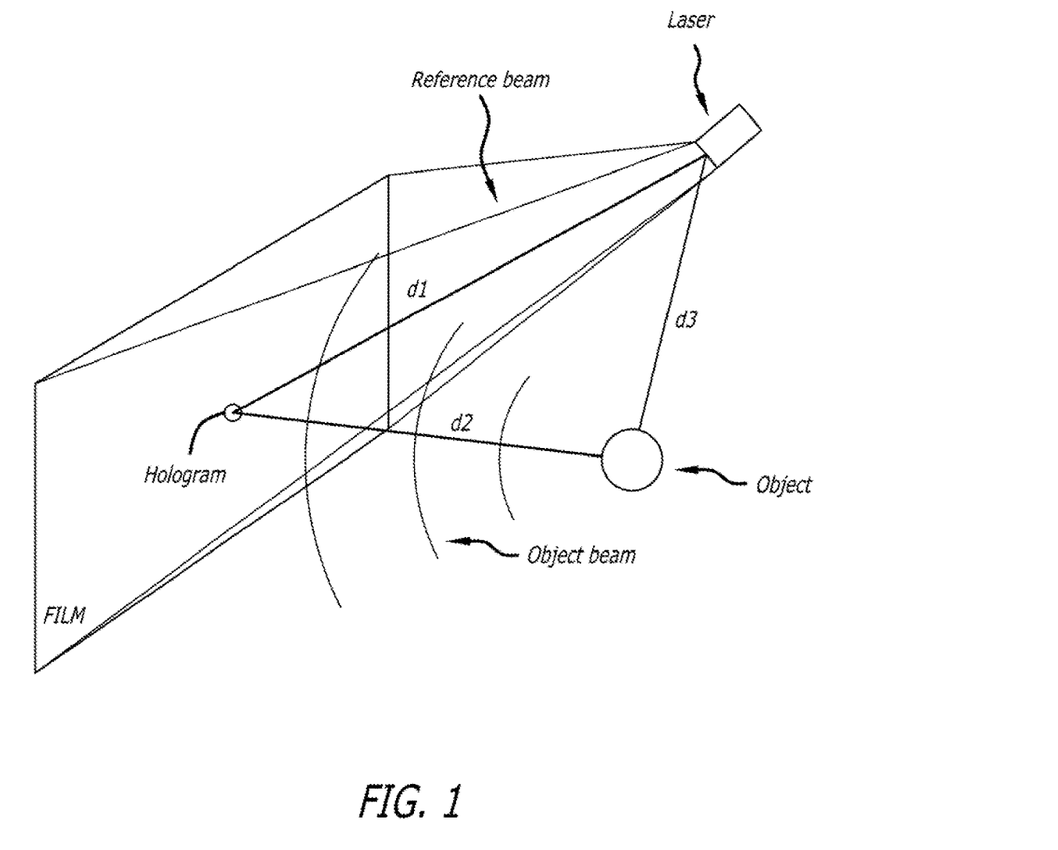
FIG. 1 illustrates an optical path set-up to produce a hologram.

Holography is a technique that allows the light scattered from an object to be recorded and later reconstructed so that it appears as if the object is in the same position relative to the recording medium as it was when recorded. The image changes as the position and orientation of the viewing system changes in exactly the same way is if the object were still present, thus making the recorded image, termed a hologram, appear three-dimensional. FIG. 1 illustrates an optical path set-up to produce a hologram.

A hologram can be produced from laser-light beams being scattered off of an object and interfered with by a reference beam. A two-dimensional recording medium, such as a photosensitive plate or holographic film, records three-dimensional volumetric phase information of an object which is termed a fringe or iterative Fourier transfer algorithm (IFTA) pattern. This procedure is similar to photography where white light scattered from photographed objects is recorded on silver halide film. Light has a phase (volume) and amplitude (intensity) but only intensity is recorded in conventional photography. A hologram, however, stores both amplitude and phase due to the interference of the reference beam. This reference beam possesses the same characteristics as scattered light because of the action of the laser. The phase information is the most important factor in holography because it provides the depth cues to the eyes and allows for an image to appear in three dimensions.

In the computer science field, a computer-generated holographic image is computed by numerically simulating the physical phenomena of light diffraction and interference. It is possible for computer software to calculate the phase of light reflected or transmitted from or through an object. Computing the phase of light of different objects, such as points, lines and wire frames, produces an interferential simulation that may in turn by transferred to a photographically sensitive media.

A holographic optical element (HOE) is a type of DOE. A holographic optical element is a hologram of a point source and acts as a lens or a mirror having optical power, i.e., the ability to focus light. The hologram consists of a diffraction pattern rendered as a surface relief which may be, for example, a thin film (created using photoresist and/or dichromated gelatin) containing an index modulation throughout the thickness of the film. "Index modulation" refers to a periodic feature set that has a linear distribution of patterns to produce novel optical effects created during the process of making the HOE. Either process (dichromated gelatin or photoresist) can be used to create a mathematical distribution to create a linear derivative producing a periodic feature set implemented into a phase mask. In one embodiment of the invention, a non-linear implementation of IFTA produces a logarithmic or otherwise hyperbolic IFPTA wave function that may be used to produce non-linear phase derivatives onto a diffractive surface. According to embodiments of the invention, holograms can be classified into two categories: (i) "reflection holograms" in which incidence and diffracted light are on the same side of the HOE; and (ii) "transmission holograms" in which incident and diffracted light are on opposite sides.

Figure 2:
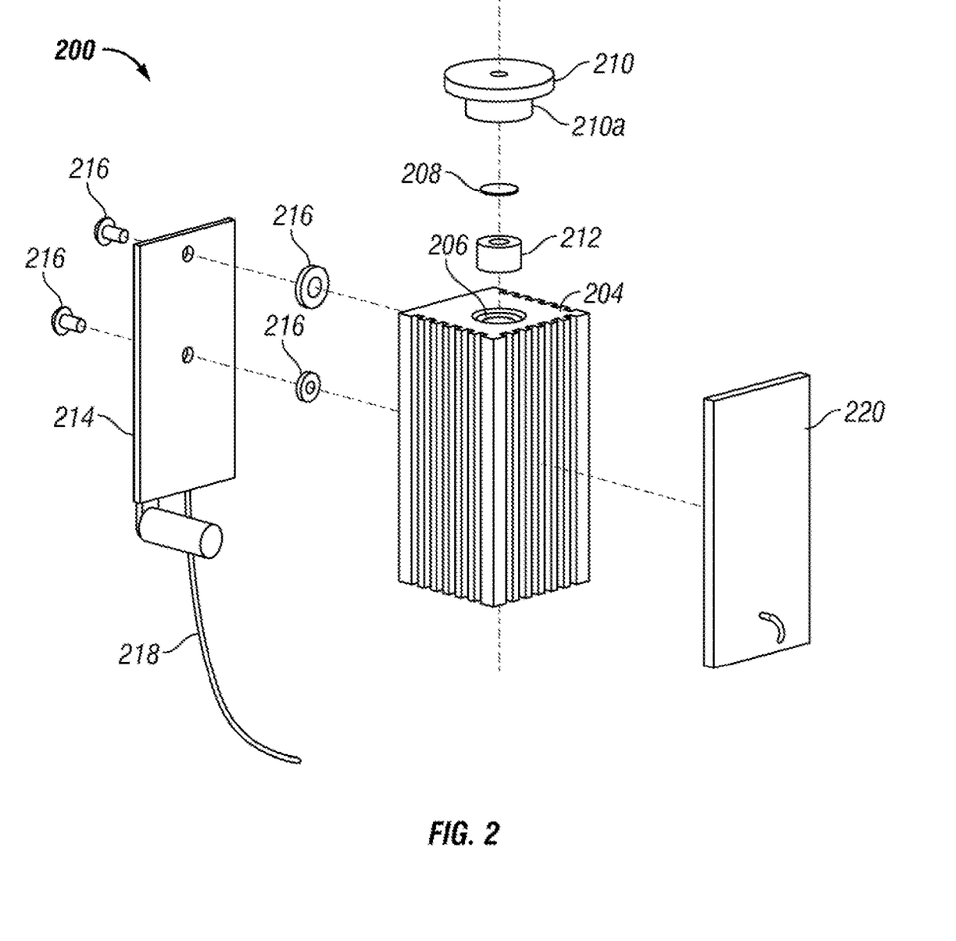
FIG. 2 illustrates an exploded view of a lighting device according to an embodiment of the invention.

FIG. 2 illustrates an exploded view of a lighting device according to an embodiment of the invention. Lighting device 200 may include a laser 202 (not shown) within a housing (not shown) situated within a heatsink 204. Heatsink 204 may absorb and dissipate heat emanating from laser 202 when power is supplied thereto. Heatsink 204 may be any suitable configuration; however, in any embodiment, heatsink 204 should define a lumen 206 therein. In the embodiment shown, heatsink 204 is approximately rectangular in configuration. In addition to securing laser 202 (within the housing), lumen 206 allows light emanating from laser 202 to project therethrough. That is, heatsink 204 generally surrounds a housing (not shown) which houses laser 202. Heatsink 204 may be made of a metal material and may have a plurality of fins to expand the surface area for increased heat dissipation. In one embodiment, laser 202 may be positioned to direct its light emanating therefrom through a holographic optical element 208. That is, HOE 208 may be positioned within a light pathway of laser 202. In an alternative embodiment, HOE 208 may be embossed and integrated into the collimation optics of laser 202.

In some embodiments, the laser of lighting device 200 is a diode pumped solid state (DPSS) laser. A DPSS laser is a device that converts some form of energy (e.g., electrical, optical, chemical) into a narrow beam of light which is monochromatic, directional and coherent. "Monochromatic" means pertaining to light of one color or to radiation of a single wavelength or narrow range of wavelengths. "Directional" means that the beam of light is very well columnated and travels over long distances with very little spread in diameter. "Coherent" means of or pertaining to waves that maintain a fixed phase relationship. The effect of one wave enhances the strength of every other wave so that the overall effect of coherent light is much greater than if the waves were not in phase. In one embodiment, the DPSS laser may be an FLPPS Class 2 single beam laser with a total laser power of about two hundred (200) milliWatts. In other embodiments, the laser of lighting device 200 is a direct diode laser light source whereas the laser light is produced from a solid state diode directly rather that a multiple optical crystal laser as in a DPSS type.

To fix HOE 208 within the light path of laser 202 (when power is supplied thereto), HOE 208 may be positioned within a stem 210a of a snap ring 210 with a snap ring retainer 212 positioned adjacent a bottom surface of HOE 208 and also within stem 210a. In one embodiment, snap ring 210, HOE 208 and snap ring retainer 212 are all cylindrical or circular in configuration. Moreover, at least snap ring 210 and snap ring retainer 212 include an opening through their centers. This feature allows the light emanating from laser 202 to pass through HOE 208 without interference from these supporting components, i.e., snap ring 210 and snap ring holder 212. Also, in one embodiment, stem 210a of snap ring 210 may be internally threaded while snap ring holder 212 may be externally threaded. As a result, snap ring holder 212 may threadedly engage with stem 210a of snap ring 210 with HOE 208 situated therein. The resultant combination may be fitted within a housing (not shown) within the lumen 206 of heatsink 204.

In one embodiment, a switched-mode power supply (SMPS) 214 (individual components not shown) may be in electrical communication with laser 202 via a wire or wires or any other means known by one of ordinary skill in the art. An SMPS is an electronic power supply unit (PSU) that incorporates a switching regulator in order to provide the required output voltage. In one embodiment, the SMPS 214 may be affixed to an outer surface of heatsink 206; however, other suitable locations for SMPS 214 are within the scope of the invention. In an alternative embodiment, a linear power supply may be used in place of SMPS 214 to provide the necessary drive voltage and current. In the embodiment in which SMPS 214 is affixed to the outside service of heatsink 204, SMPS 214 may be affixed by screws and washers 216 or equivalent affixing mechanism known by one of ordinary skill in the art. A distal end of a wire 218 may be electrically connected to SMPS 214 while a proximal end of wire 218 (not shown) may be in electrical communication with another circuit board (not shown) and eventually to an outside power source (not shown). In one embodiment, a blanket 220 may be positioned on an opposite side of heatsink 204 relative to SMPS 214 (as shown).

Figure 3:
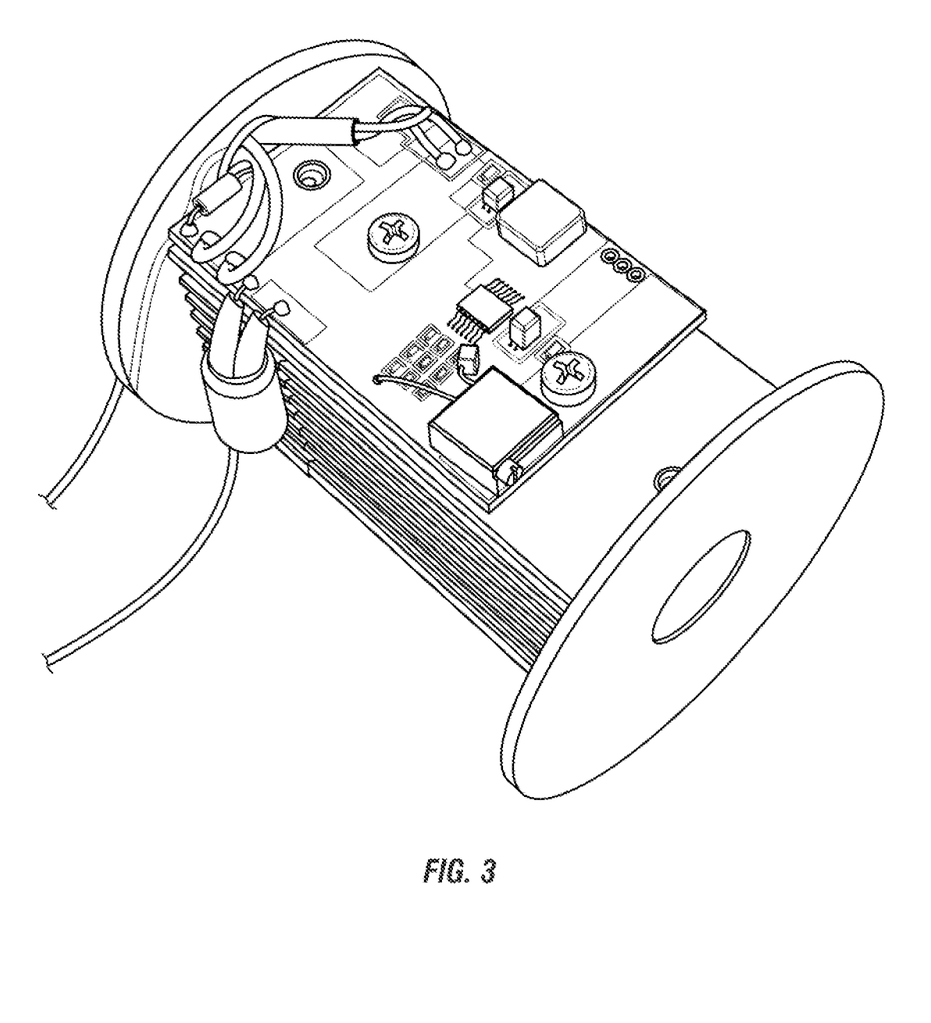
FIG. 3 illustrates a perspective view of the lighting device of FIG. 2 in an assembled configuration.

A switched-mode power supply (SMPS) is an electronic power supply unit (PSU) that incorporates a switching regulator. The SMPS rapidly switches a power transistor between saturation (full on) and cutoff (completely off) with a variable duty cycle whose average is the desired output voltage. The resulting rectangular waveform is low-pass filtered with an inductor and capacitor. The main advantage of this method is greater efficiency because the switching transistor dissipates little power in the saturated state and the off state compared to the semiconducting state (active region). Other advantages include smaller size and lighter weight (from the elimination of low frequency transformers which have a high weight) and lower heat generation from the higher efficiency. In this regard, lighting device 200 exhibits higher efficiency and improved performed over other types of accent lighting. FIG. 3 illustrates a perspective view of the lighting device 200 of FIG. 2 in an assembled configuration.

The components as previously described may comprise an embodiment of a lighting device according to the invention. Lighting device 200 may be adapted to fit virtually any commercially available light fixture including, but not limited to, track lights, incandescent lighting fixtures, recessed can lighting, uplights or spot lights. In one embodiment, an adapter ring (not shown) may be used in conjunction with lighting device 200 to facilitate the connection of lighting device 200 with any of the available light fixtures previously mentioned.

Figure 4:
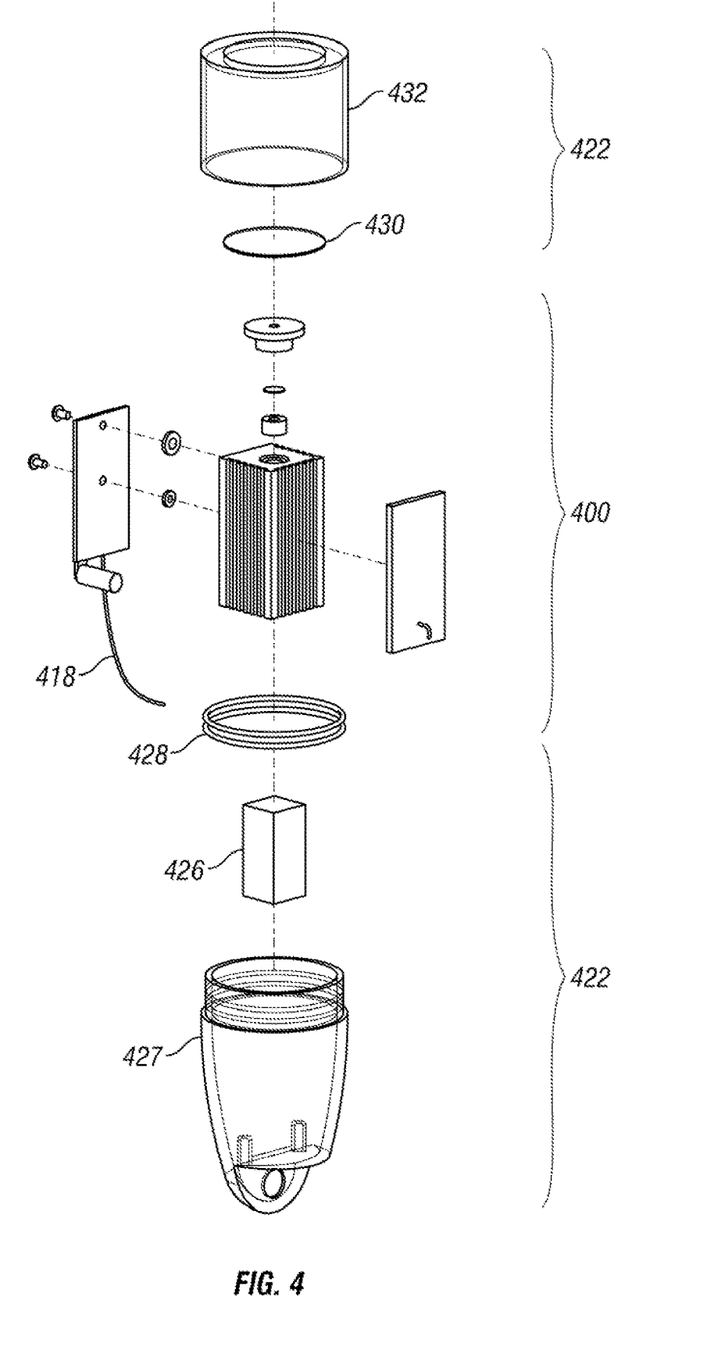
FIG. 4 illustrates an exploded view of the lighting device of FIG. 2 in relation to a track light fixture.
Figure 5:
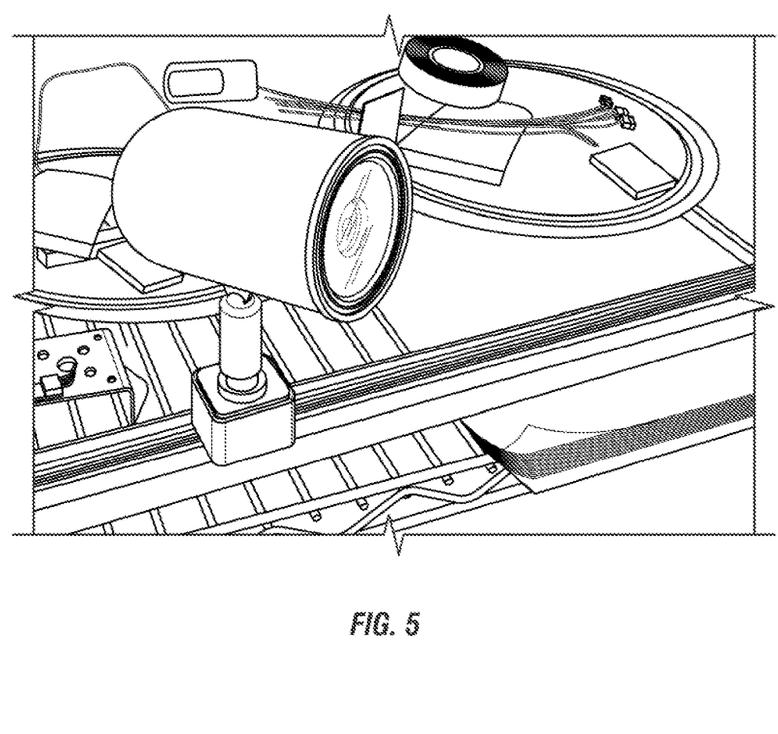
FIG. 5 illustrates a perspective view of the lighting device of FIG. 3 within a track lighting fixture.

FIG. 4 illustrates an exploded view of the lighting device of FIG. 2 in relation to a track light fixture 422. At a proximal end, track light fixture 422 includes a housing bottom 424, foam 426 and an O-ring 428. Foam 426 and O-ring 428 fit within housing bottom 424. At a distal end, track light fixture 422 includes a glass component 430 and a housing top 432. In one embodiment, a lighting device 400 is situated between the proximal end of track light fixture 422 and the distal end of track light fixture 422. The proximal end of wire 418 may be electrically coupled to electrical circuitry within track light fixture 422. When power is supplied thereto, the composite light apparatus, i.e., light device 400 and track light fixture 422 in this particular embodiment, may project a static or movable (i.e., animated) star field (i.e., pin-point lights) and/or static or movable clouds. The stars may be any color; in one embodiment, the stars of the star field are green. Additionally, the clouds may be any color such as, but not limited to, red, orange, green, cyan, sky blue, royal blue and/or white. In one embodiment, lighting device 400 has dimming capabilities. FIG. 5 illustrates a perspective view of the lighting device of FIG. 3 within a track lighting fixture.

Figure 6:
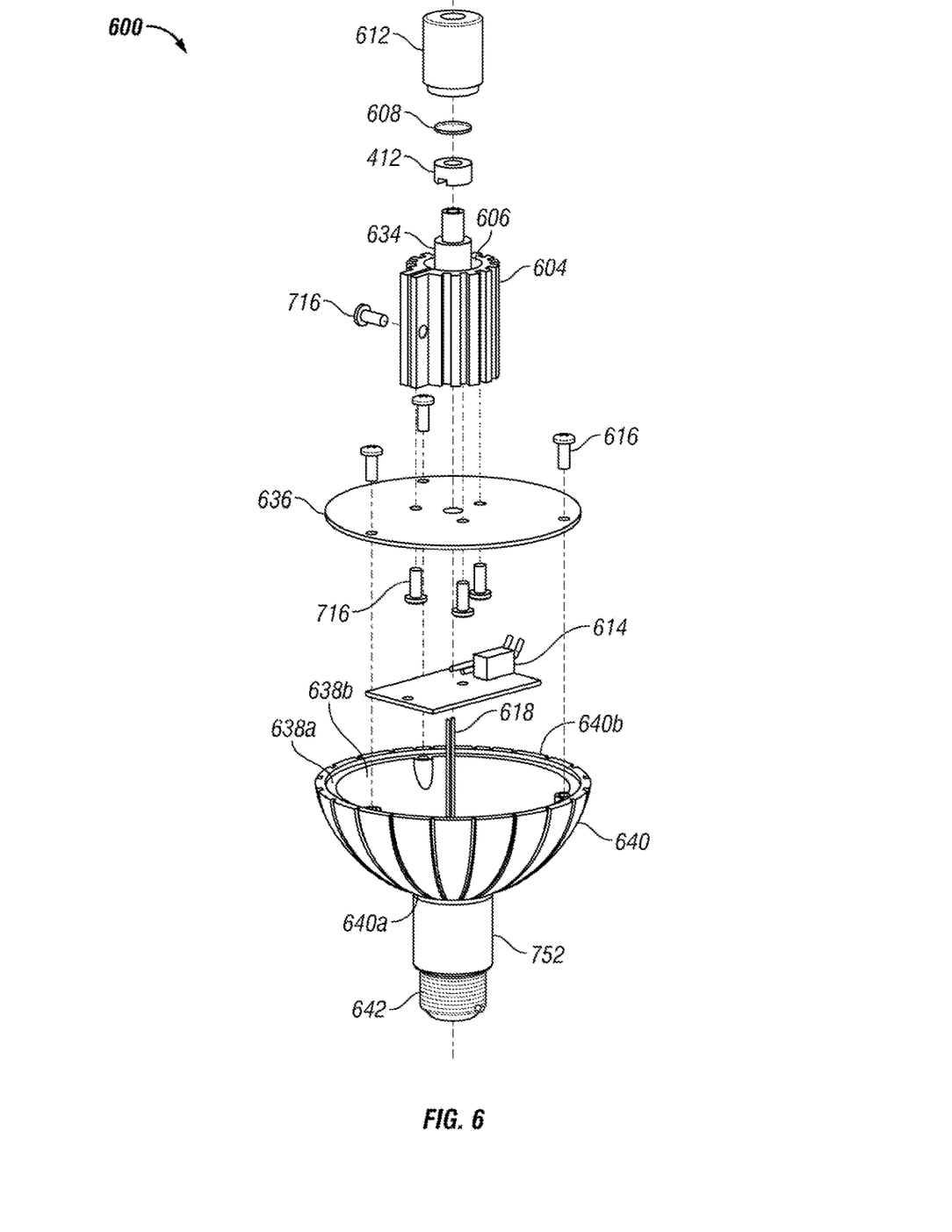
FIG. 6 illustrates an exploded view of a lighting device according to an alternative embodiment of the invention.

FIG. 6 illustrates an exploded view of a lighting device according to an alternative embodiment of the invention. Similar to the lighting device described with respect to FIG. 2, lighting device 600 includes a laser 602 (not shown) situated within a housing 634 which in turn is situated within a lumen 606 defined by a heatsink 604. In the embodiment shown, heatsink 604 is approximately cylindrical in configuration. Heatsink 604 may be made of the same or similar material and may have the same or similar features, i.e., fins, as those described with respect to FIG. 2. In one embodiment, heatsink 604 is comprised of two separate components and secured together by a screw or equivalent securing means. Laser 602 (housed within housing 634) may be positioned to direct light emanating therefrom through a holographic optical element 608. In an alternative embodiment, HOE 608 may be embossed and integrated into the collimation optics of laser 602. Laser 602 may be the same or substantially the same as that described with respect to FIG. 2.

To fix HOE 608 within the light path of laser 602 (when power is supplied thereto), HOE 608 (or multiple HOEs) may be secured between two glass frits (not shown) and positioned within an inner top surface of a laser cap 612. Laser cap 612 may threadedly engage with the housing 634 which houses laser 602. Laser cap 612 may be of a different material relative to a material comprising the housing 634. In some embodiments, a tinted frit (not shown) is positioned within the light path of laser 602 thereby imparting color to the resulting light emanating from laser 602. The components described, i.e., housing 634 (including all sub-components, if any) and laser cap 612 include an opening through their centers so that light emanating from laser 602 passes through to the external environment. This feature allows the light emanating from laser 602 to pass through HOE 608 without interference from these supporting components, i.e., laser cap 612 and housing 634.

In one embodiment, heatsink 604 may be affixed to a plate 636 by screws 616 or any other suitable fastening means. In turn, plate 636 may rest within a first recess 638a of a second heatsink 640. Second heatsink 640 may have a hemispherical-like configuration; however, other suitable configurations are within the scope of the invention. Second heatsink 640 may have a bottom end 640a (i.e., a first end) having a first diameter and a top end 640b (i.e., a second end) having a second diameter wherein the first diameter is smaller than the second diameter. Similar to heatsink 604, second heatsink 640 may have a plurality of fins on an outer periphery thereof. In some embodiments, a switched-mode power supply (SMPS) 614 may be housed within a second recess 638b of second heatsink 640. It should be appreciated that second recess 638b has a much greater depth relative to first recess 638a and that first recess 638a is peripheral in nature, i.e., approximates a ledge within second heatsink 640. In one embodiment, the bottom end 640a may be connected to a threaded base 642 which is adapted to retrofit into a socket of a light fixture wherein the threaded base 642 is in electrical communication with the laser 602.

Figure 7:
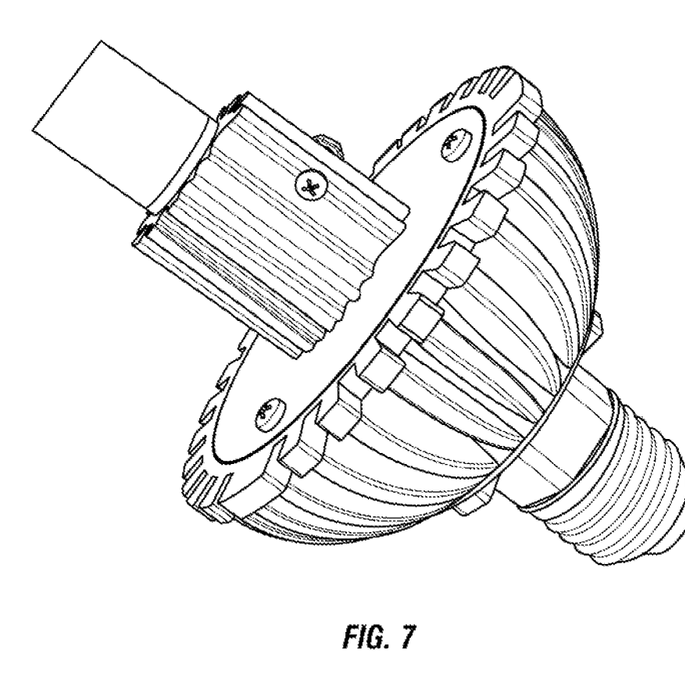
FIG. 7 illustrates a perspective view of the lighting device of FIG. 6 in an assembled configuration.

In one embodiment, a switched-mode power supply (SMPS) 614 (individual components not shown) may be in electrical communication with laser 602 via a wire or wires or any other means known by one of ordinary skill in the art. In one embodiment, the SMPS 614 may rest within second recess 638*b* of second heatsink 640. A distal end of a wire 618 may be electrically connected to SMPS 614 while a proximal end of wire 618 (not shown) may be in electrical communication with another circuit board such as the Led-Friend Part No. LF-G109 (not shown, available from Shenzhen Ledfriend Optoelectrics Co. Ltd.) and eventually to an outside power source (not shown). As with the embodiment described with respect to FIG. 2, lighting device 600 exhibits higher efficiency and improved performed over other types of accent lighting due to the SMPS 614. FIG. 7 illustrates a perspective view of the lighting device 600 of FIG. 6 in an assembled configuration.

The components as previously described may comprise a lighting device adapted to retrofit into a pre-existing light fixture. The lighting device may be adapted to fit virtually any commercially available light fixture including, but not limited to, track lights, incandescent lighting fixtures, recessed can lighting, uplights or spot lights. The lighting devices according to embodiments of the invention provide a pleasing, versatile and unique lighting experience. Additionally, such lighting devices provide an energy efficient way to provide accent lighting to a particular venue, such as a home or party venue. Moreover, the lighting device according to embodiments of the invention may be retrofitted to available light fixtures such as those described previously.

While certain exemplary embodiments have been described and shown in the accompanying drawings, it is to be understood that such embodiments are merely illustrative of and not restrictive on the broad invention, and that this invention is not to be limited to the specific constructions and arrangements shown and described, since various other modifications may occur to those ordinarily skilled in the art.

What is claimed is:

1. A lighting device, comprising:
   a directional coherent light source;
   a diffractive holographic optical element positioned within a light pathway of the coherent light source when power is supplied thereto; and
   a switched-mode power supply (SMPS) in electrical communication with the coherent light source to supply power thereto, and
   a threaded base such that the device is adapted to retrofit into a pre-existing light fixture.

2. The lighting device of claim 1, further comprising:
   a housing to house the coherent light source, the housing having an opening to allow light emanating from the coherent light source to project therethrough; and
   a first heatsink positioned about the housing.

3. The lighting device of claim 2 wherein the first heatsink defines a lumen, the lumen having the housing therein, the first heatsink having a plurality of fins on an outer periphery thereof.

4. The lighting device of claim 3, further comprising, a threaded base adapted to retrofit into a socket of the light fixture, the threaded based in electrical communication with the coherent light source.

5. The lighting device of claim 4, further comprising:
   a plate to secure the housing and the first heatsink thereto; and
   a second heatsink having a first recess to situate the plate therein and a second recess to house the SMPS, the second heatsink connected to the threaded base.

6. The lighting device of claim 5 wherein the second heatsink has a first end having a first diameter and a second end having a second diameter, the first diameter smaller than the second diameter, the second heatsink having a plurality of fins on an outer periphery thereof.

7. The lighting device of claim 5, further comprising:
   a printed circuit board positioned between the threaded base and the second heatsink, the printed circuit board in electrical communication with the threaded base and the SMPS.

8. The lighting device of claim 1 wherein the coherent light source is one of a diode pumped solid state laser or a direct diode laser.

9. The lighting device of claim 1 wherein the holographic optical element is embossed and integrated into collimation optics of the laser.

10. The lighting device of claim 1 wherein, when the lighting device is retrofitted to the light fixture and when power is supplied thereto, the lighting device projects a plurality of pin-point lights, the pin-point lights comprising a star field.

11. The lighting device of claim 1 wherein the pre-existing light fixture is one of a track light, an incandescent lighting fixture, a recessed can lighting fixture, an uplight or a spot light.

12. The lighting device of claim 3 wherein the SMPS is attached to the first heatsink.

13. The lighting device of claim 12 wherein one end of the lighting device is adapted to secure to a lens and the other end is adapted to secure to a plate.

14. The lighting device of claim 1 wherein the device has dimming capabilities.

15. A lighting device adapted to retrofit into a pre-existing lighting fixture, comprising:
   a directional coherent light source housed within a housing, the housing having an opening through which light from the coherent light source projects therethrough when power is supplied thereto;
   a diffractive holographic optical element fixed within a retainer, the retainer positioned within a light pathway of the coherent light source when power is supplied thereto, the retainer having an opening in substantial alignment with the opening in the housing;
   a switched-mode power supply (SMPS) in electrical communication with the coherent light source to supply power thereto; and
   a threaded base such that the device is adapted to retrofit into a pre-existing light fixture.

16. The lighting device of claim 15, further comprising, a heatsink positioned about the housing.

17. The lighting device of claim 16 wherein the heatsink defines a lumen, the lumen having the housing therein, the heatsink having a plurality of fins on an outer periphery thereof.

18. The lighting device of claim 15 wherein the coherent light source is one of a diode pumped solid state laser or a direct diode laser.

19. The lighting device of claim 15 wherein the holographic optical element is embossed and integrated into collimation optics of the laser.

20. The lighting device of claim 15 wherein, when the lighting device is retrofitted to the light fixture and when power is supplied thereto, the lighting device projects a plurality of pin-point lights, the pin-point lights comprising a star field.

21. A lighting device, comprising:
   a coherent light source powered by a power source;

a holographic diffraction grating positioned within a light pathway of the coherent light source when power is supplied thereto; and a threaded base adapted to retrofit into a pre-existing light fixture, wherein, when power is supplied thereto, the light passing through the holographic diffraction grating projects a plurality of pin-point lights, the pin-point lights comprising a star field.

22. The lighting device of claim 21, further comprising, a heatsink positioned about the light source.

23. The lighting device of claim 22 wherein the heatsink defines a lumen, the lumen having the housing therein, the heatsink having a plurality of fins on an outer periphery thereof.

24. The lighting device of claim 21 wherein the coherent light source is one of a diode pumped solid state laser or a direct diode laser.

25. The lighting device of claim 21 wherein the holographic optical element is embossed and integrated into collimation optics of the laser.

* * * * *